United States Patent [19]

Park

[11] Patent Number: 4,962,324

[45] Date of Patent: Oct. 9, 1990

[54] EQUALIZING CIRCUIT FOR A SENSE AMPLIFIER

[75] Inventor: Hee-Choul Park, Seoul, Rep. of Korea

[73] Assignee: Samsung Electronics, Ltd., Suwon, Rep. of Korea

[21] Appl. No.: 292,769

[22] Filed: Jan. 3, 1989

[30] Foreign Application Priority Data

Apr. 30, 1988 [KR] Rep. of Korea ............... 88-5050

[51] Int. Cl.⁵ .............................. H03K 5/24
[52] U.S. Cl. .................... 307/350; 307/451; 307/452; 307/530; 365/203; 365/208
[58] Field of Search ............. 307/350, 481, 451, 452, 307/530; 365/203, 205, 207, 208

[56] References Cited

U.S. PATENT DOCUMENTS

| | | | |
|---|---|---|---|
| 4,539,494 | 9/1985 | Kurafuji | 307/530 |
| 4,712,197 | 12/1987 | Sood | 365/230 |
| 4,751,680 | 6/1988 | Wang et al. | 365/203 |

FOREIGN PATENT DOCUMENTS

| | | | |
|---|---|---|---|
| 1665404 | 1/1986 | European Pat. Off. | 365/203 |
| 0222089 | 10/1986 | Japan | 365/203 |

Primary Examiner—Stanley D. Miller
Assistant Examiner—T. Cunningham
Attorney, Agent, or Firm—Ladas & Parry

[57] ABSTRACT

This present invention provides an equalizing cicruit for a sense amplifier comprising a sense amplifier enable signal generation section which receives a sense amplifier equalizing signal and produces a sense amplifier enable signal. An equalizing control section is connected to receive a signal from the sense amplifier enable signal generation section and the sense amplifier equalizing signal. A first and second sense amplifier equalizing signal generation sections are connected to receive an output from the equalizing control section. A third sense amplifier equalizing signal generation section is connected to receive a signal through the second sense amplifier equalizing signal generation section.

2 Claims, 6 Drawing Sheets

EQUALIZING CIRCUIT FOR A SENSE AMPLIFIER

BACKGROUND OF THE INVENTION

This invention relates to an equalizing circuit for a differential sence amplifier to achieve a high sensing speed and a stable sensing operation.

For a SRAM, a sense amplifier has been normally used to sense the the data in each cell. To improve sensing speed, the equalizing technique for a sense amplifier is needed. This will now be described with reference to the FIGS. 1 to 4.

In FIG. 1, there are shown several circuit diagrams. A precharge circuit is composed with the combination of transistors $T_{12}$–$T_{14}$. A SRAM cell consists of transistors $T_1$–$T_4$ and resistors $R_1$, $R_2$. A block sense amplifier BS has the circuit arrangement composed of, in combination, transistors $T_{15}$–$T_{39}$ for sensing the data in the SRAM cell. Transistors $T_{40}$–$T_{68}$, in combination, compose a final sense amplifier FS which senses wholly data in other block sense amplifiers as well as the block sense amplifier BS. A data output buffer DB to store data from the final sense amplifier FS is composed, in combination, of transistors $T_{70}$–$T_{97}$. A latch LA in the data output buffer DB consists of the transistors $T_{74}$–$T_{77}$.

FIG. 2 is a circuit diagram showing a general address input terminal and short pulse generation circuit, in which when a latest address signal XAi has a transition, short pulse output signals SPGH and SPGL are produced by the combination circuit of transistors.

FIG. 3 is a short pulse summator in which a short pulse signal $\phi PX$ is produced by both a signal $\overline{CS}$ and the combination of transistors with the inputted signals SPGH and SPGL.

In the circuit configuration depicted in FIG. 4, a bit line enable signal $\overline{\phi PXBi}$, a sense amplifier enable signal $\phi SA$ and a sense amplifier equalizing signal $\phi PZ$ are generated. The signal $\phi PX$ is turned into the signal $\overline{\phi PXBi}$ through the combination circuit of transistors $T_{101}$–$T_{106}$ and a signal $\phi PY$ which is the summation of short pulses that a column address produces is changed into the signal $\overline{\phi PZ}$ through the combination circuit of transistors $T_{107}$–$T_{114}$. The signal $\overline{\phi PZ}$ is changed into a sense amplifier enable signal $\phi SA$, a first sense amplifier equalizing signal $\phi PZ1$, and a second sense amplifier equalizing signal $\phi PZ2$ through three sections A, B, and C. The section A is the sense amplifier enable signal generator composed of the combination of transistor $T_{115}$–$T_{134}$. The second B with the transistors $T_{111}$–$T_{114}$ and the section C with the transistors $T_{135}$–$T_{144}$ are the first equalizing signal generator and the second equalizing signal generator, respectively.

The operation of the prior sense amplifier equalizing circuit with the above arrangement will now be described with reference the FIG. 6. When the extra-input address signal XAi is changed, the signal $\overline{\phi PXBi}$ is produced. At this time, the signals $\overline{\phi PZ1}$, $\overline{\phi PZ2}$ and $\overline{\phi PZ3}$ are produced with the pulse width of Teq$_1$, Teq$_2$ and Teq$_3$, respectively. When the signals $\overline{\phi PZ1}$, $\overline{\phi PZ2}$ and $\overline{\phi PZ3}$ go from high levels to low levels the signals SAO1, $\overline{SAO1}$, SAO2, $\overline{SAO2}$, SAO4, $\overline{SAO4}$ and an output signal of the sense amplifier are equalized; when the signals $\overline{\phi PZ1}$, $\overline{\phi PZ2}$ and $\overline{\phi PZ3}$ go from low levels to high levels, the sensing of data begins; the sensing of data is completed with the transition from a high level to a low level in the signal $\phi SA$.

The sensed data during a sensing cycle is stored in the latch LA existing in the data output buffer DB(FIG. 1). The width of pulses Teq$_1$, Teq$_2$ and Teq$_3$ are determined by the time which is needed at least to equalize the output of the sense amplifier, normally from 7 nano-seconds to 20 nano-seconds. However, there are so many times which the equalized output is unstable because of a number of the narrow-width pulse. Accordingly, the pulse width for equalization needs to be enlarged to obtain a stable equalized signal, but there is occurred a problem that an access time is delayed. In addition, if noises have invaded during an equalizing period, the output of a sense amplifier may not be equalized in a correst way.

SUMMARY OF THE INVENTION

The present invention has been made in consideration of these problems and has its object to provide an equalizing circuit for a sense amplifier in which an equalizing operation stops only when a sense amplifier amplifies data.

In the circuit arrangement according to the present invention, the equalizing time is sufficient long at a standby state so that the circuit is strong against $V_{cc}$ and $V_{ss}$ noises.

DESCRIPTION OF THE PREFERRED EMBODIMENT

This invention will now be described with reference to the accompanying drawings.

Figure 5:
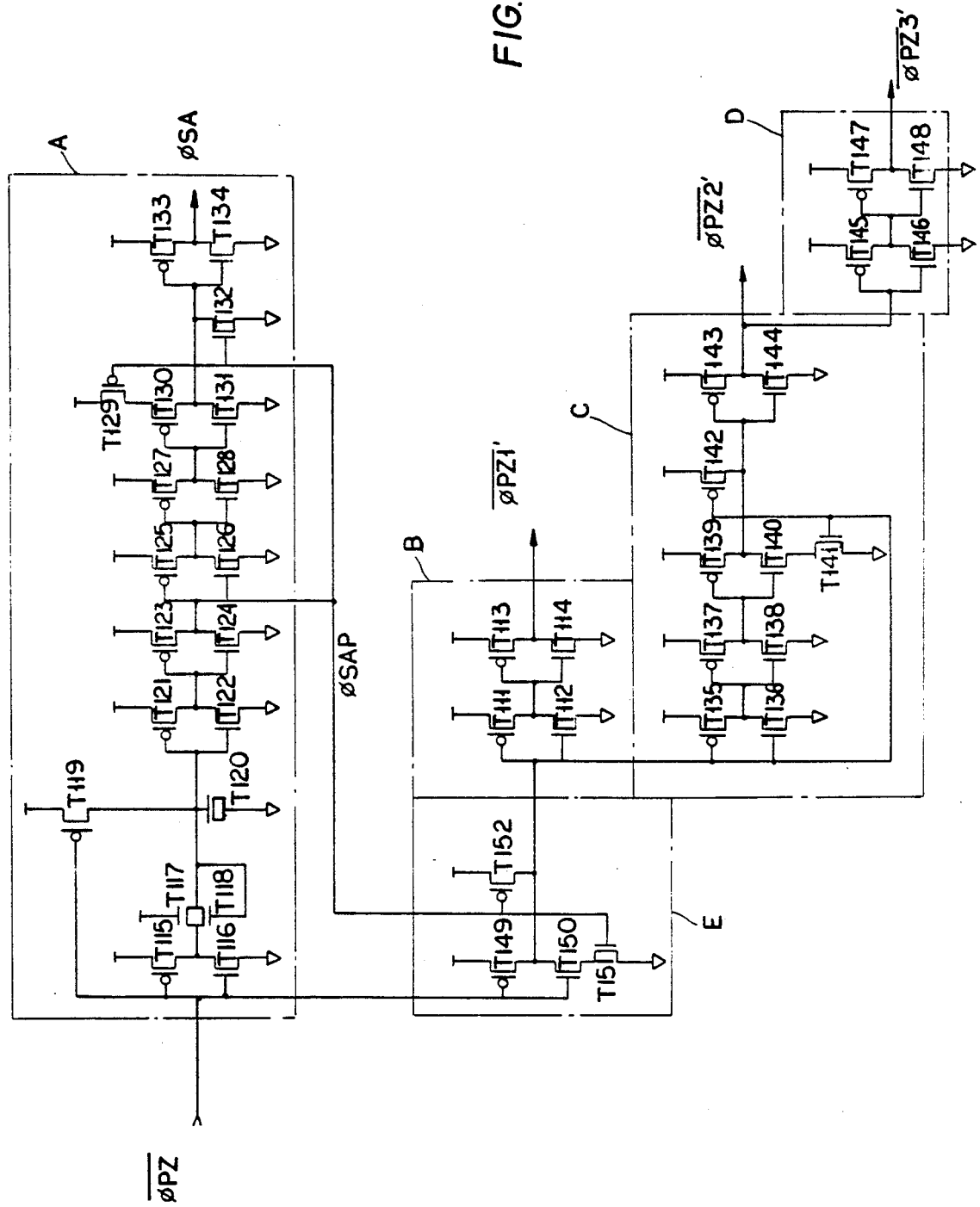
FIG. 5 is a circuit diagram illustrating a sense amplifier equailizing signal generation section in accordance with the present invention.
Figure 6:
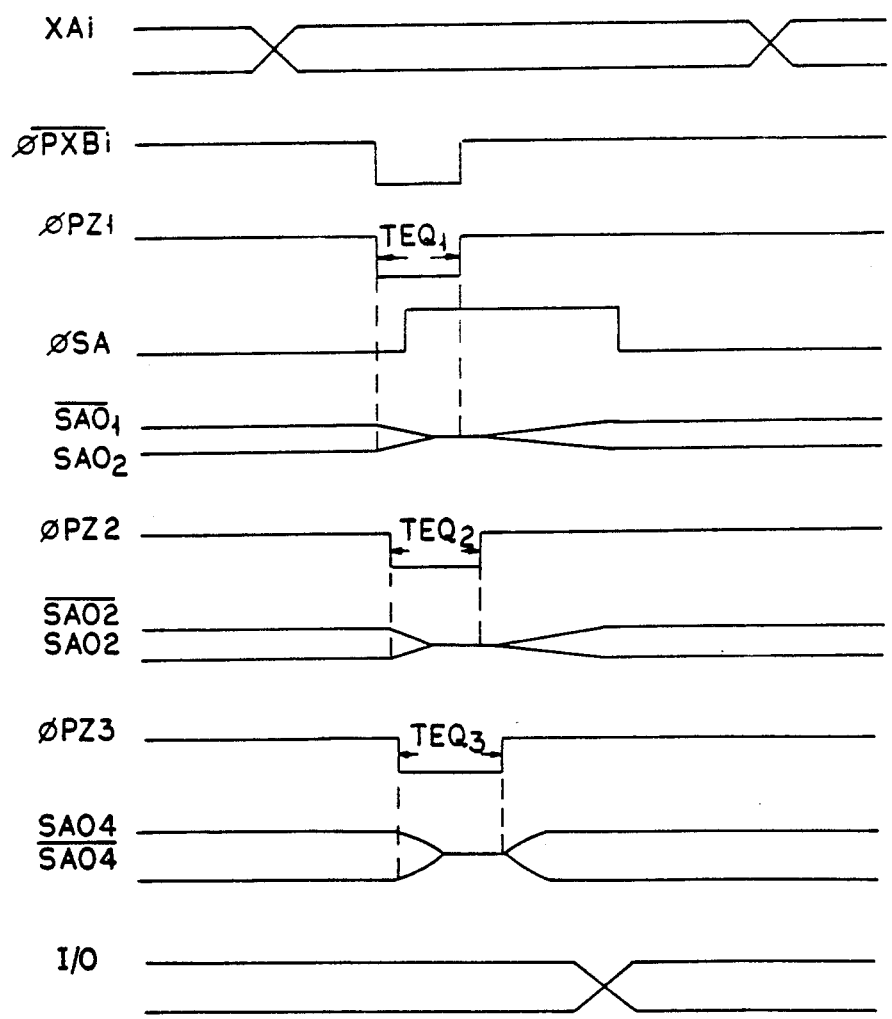
FIG. 6 is a timing chart in a read/write mode in the prior art.

Referring to FIG. 5, a sense amplifier equalizing signal $\overline{\phi PZ}$, produced from the signals $\phi PX$, $\phi PY$ through the signal pulse combination circuit, is connected to produce a sense amplifier enable signal $\phi SA$ through a sense amplifier enable signal generation section A composed of the transistors $T_{115}$–$T_{134}$; both the signal $\phi SAP$ from the sense amplifier enable signal generation section A and the signal $\overline{\phi PZ}$ are connected to be inputted into an equalizing control section E; an output from the equalizing section is connected to be inputted in common into a first and second sense amplifier equalizing signal generation sections B and C; and an output from the second sense amplifier equalizing signal generation section C is connected to be inputted into a third sense amplifier equalizing signal generation section D composed of the transistors $T_{145}$–$T_{148}$, thereby signals $\overline{\phi PZ1}$, $\overline{\phi PZ2}$ and $\overline{\phi PZ3}$ are produced from the first, second, and third sense amplifier equalizing signal generation sections, respectively.

The operation of the invention is as follows.

Figure 1:
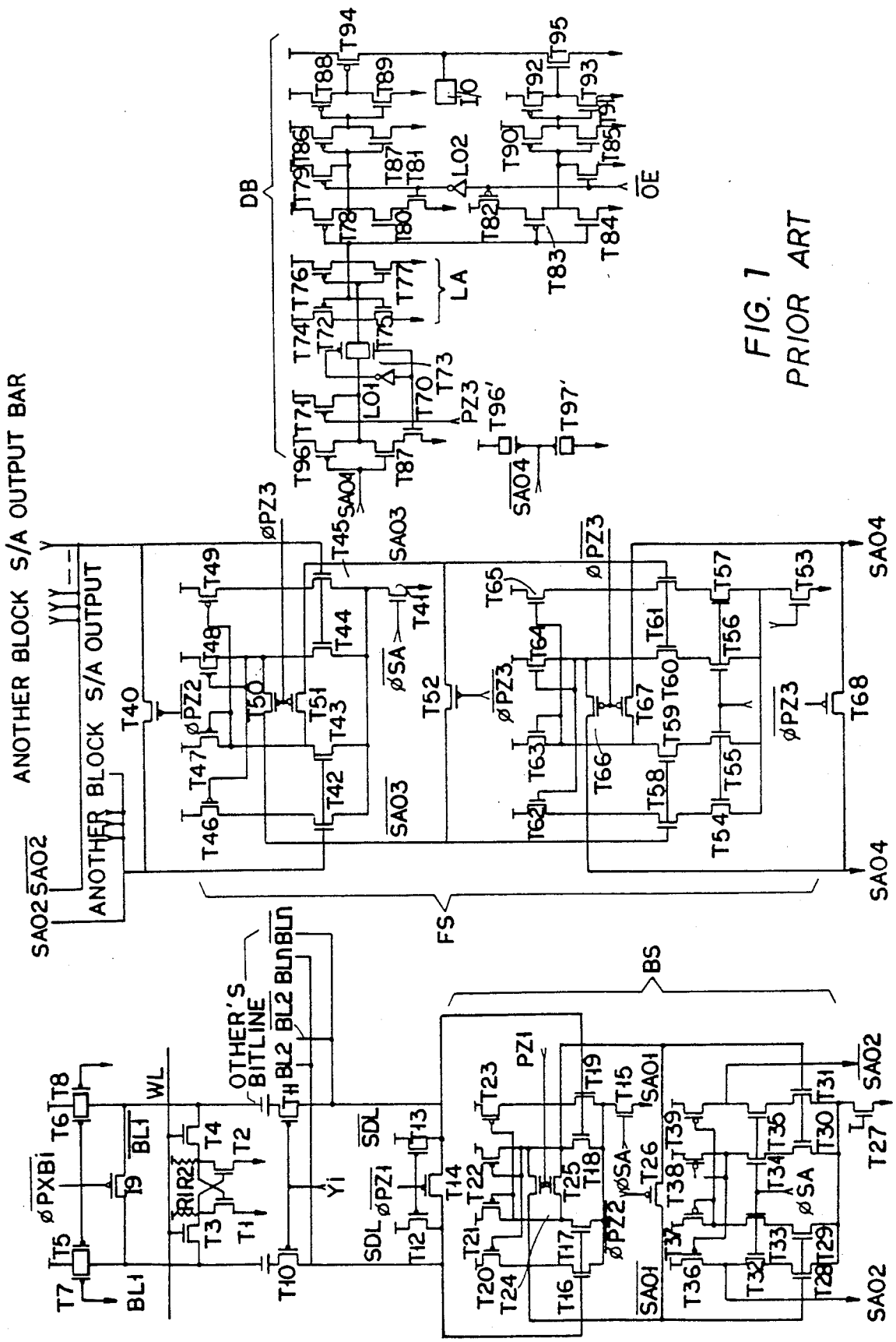
FIG. 1 is circuit diagrams illustrating a prior cell, sense amplifier, and data output buffer of a SRAM.
Figure 2:
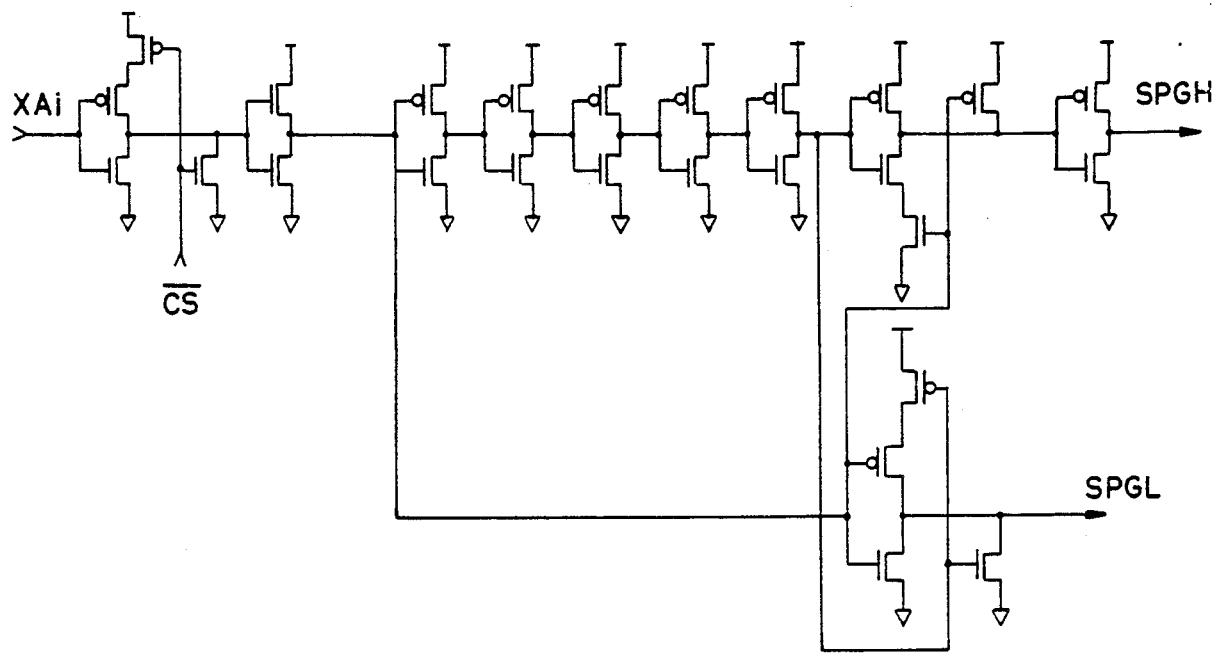
FIG. 2 is a circuit diagram showing an address input terminal and a short pulse generation circuit.
Figure 3:
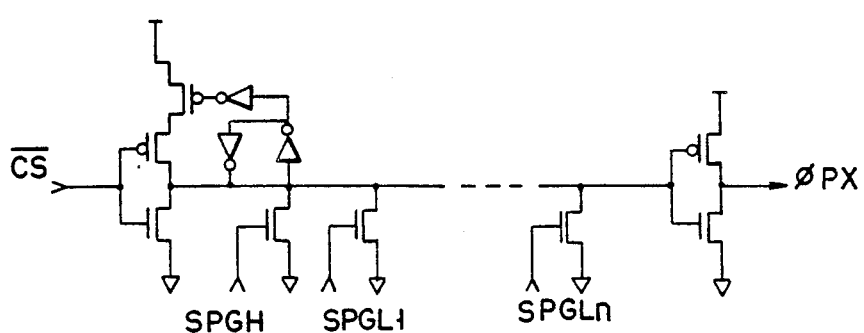
FIG. 3 is a short pulse combination circuit diagram.
Figure 4:
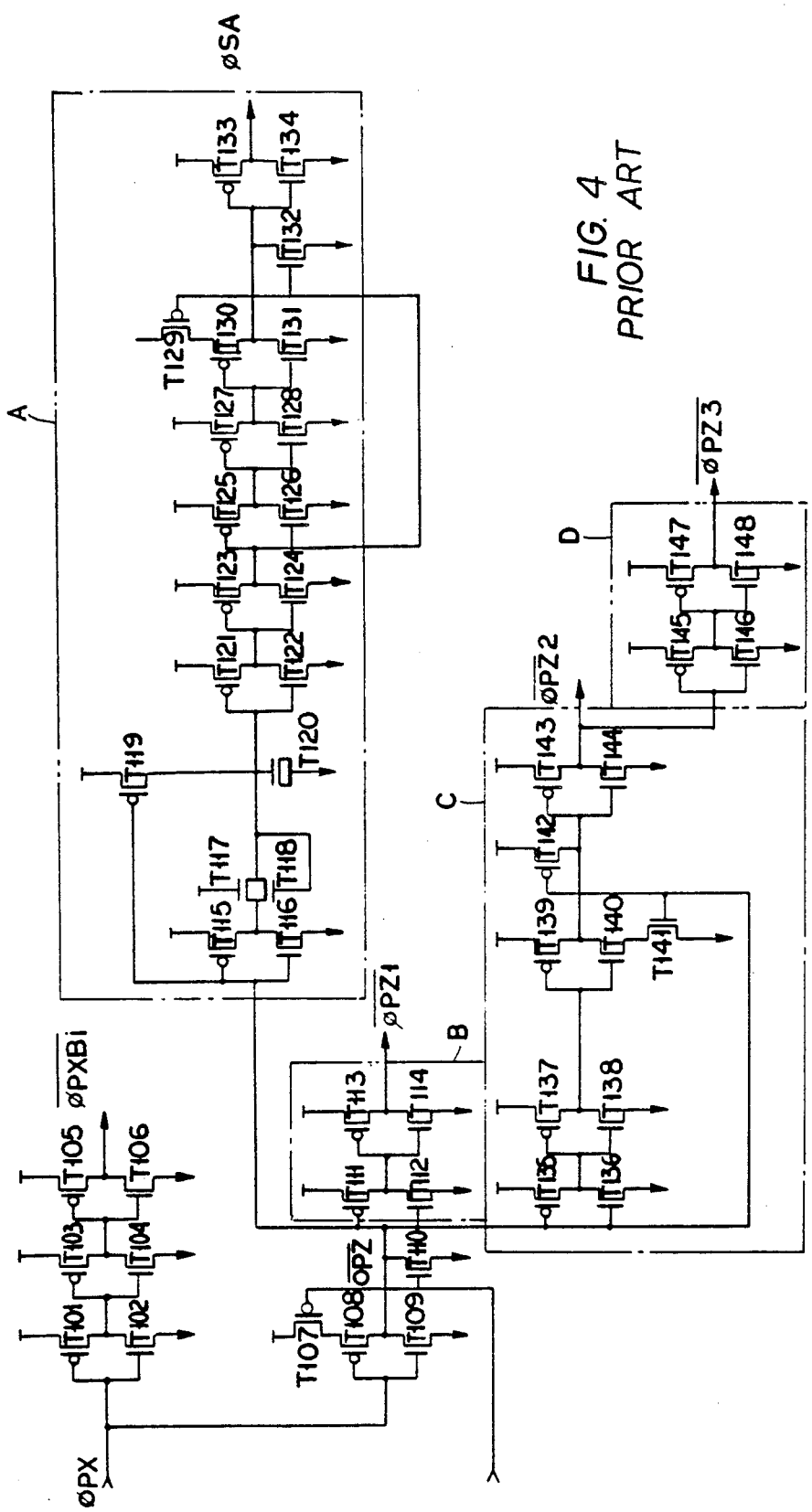
FIG. 4 is circuit diagram showing generation circuits for a bit line enable signal, a sense amplifier signal and an equalizing circuit of a sense amplifier.

In FIG. 1, the bit line enable signal $\overline{\phi PXBi}$ while is produced when the latest address signal or a chip selecting signal is changed causes the bit line pair BL1 and $\overline{BL1}$ to be equalized in the level of the voltage source $V_{cc}$ with the operation of the precharge circuit comprising transistors $T_5$–$T_8$.

At this time, the precharge circuit of transistors $T_{12}$–$T_{14}$ makes, as the almost same sychronization as the signal $\overline{\phi PXBi}$, a select data line pair SDL, $\overline{SDL}$ to be precharged in the same level as in the bit line pair BL1, $\overline{BL1}$.

On the other hand, both the equalizing signal $\overline{\phi PZ}$ and the signal $\phi SAP$ from the sense amplifier enable generation section A are composited in the equalizing control section E, and then the signals $\overline{\phi PZ1}$, $\overline{\phi PZ2}$ and $\overline{\phi PZ3}$ are produced through the first, second and third equalizing signal generation sections B, C, D, respectively. When these signals are in a low level, the transistors $T_{24}$–$T_{26}$, $T_{40}$, $T_{50}$–$T_{52}$ and $T_{66}$–$T_{68}$ which equalize the output of the sense amplifier in FIG. 1 are operated. For a high level of the signal $\phi SA$, the detected data is stored in the latch LA in the data output buffer DB. After the detected data is fully stored, the signal $\phi SA$ goes to a low level to reduce the currents flowing in the sense amplifier.

Figure 7:
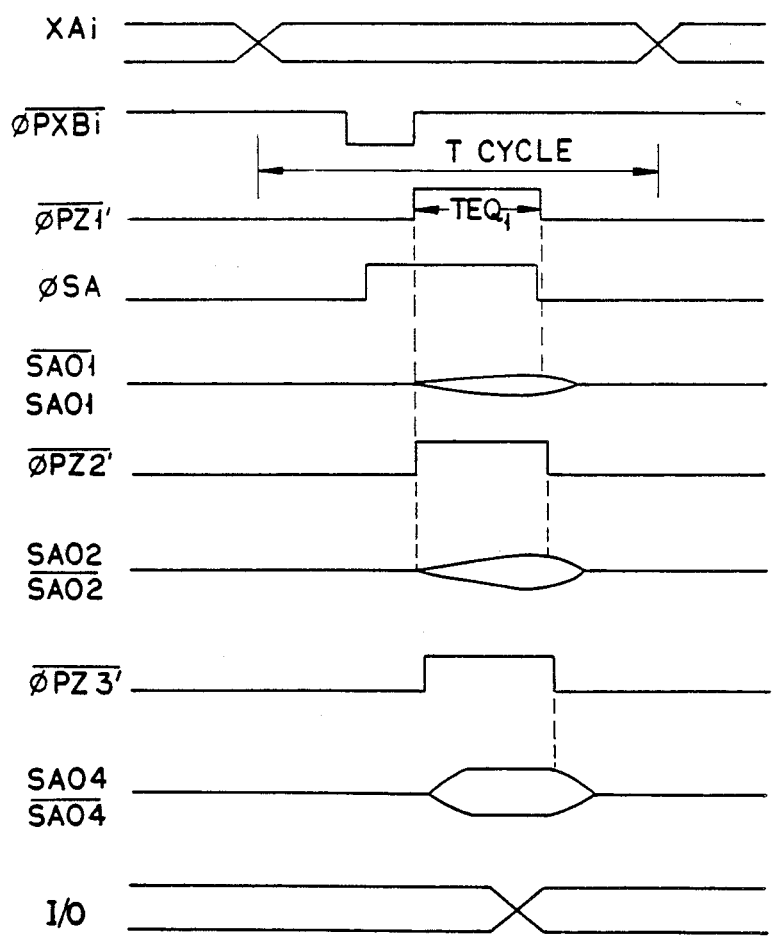
FIG. 7 is a timing chart in a read/write mode in the circuit of the present invention.

In a read mode, the timing chart is shown in FIG. 7. We observe that the equalizing time is T-Teq1'(T is a cycle time of all chip); that is the signal $\overline{\phi PZ1}'$ is a low level. Therefore the detected data is stored in the latch LA during the non-equalizing time Teq'. When the signal $\phi SA$ is changed into a low level, the amplification of data is obtained because the output pairs SAO1, $\overline{SAO1}$–SAO4, $\overline{SAO4}$ are equalized.

As described above, since the circuit according to the present invention has a sufficient equalizing time in sensing, the reliability in sensing mode can be improved; the data is amplified in a fully equalized state so that the circuit is strong against $V_{cc}$ and $V_{ss}$ nosies.

The invention is in no way limited to the example described hereinabove. Various modifications of the disclosed embodiment, as well as other embodiments of the invention, will become apparent to persons skilled in the art upon reference of the description of the invention. It is therefore contemplated that the appended claims will cover any such modifications or embodiments as fall within the true scope of the invention.

What is claimed is:

1. An equalizing circuit for a sense amplifier comprising:
    a sense amplifier enable signal generation means for receiving a sense amplifier equalizing signal and for generating a sense amplifier enable signal;
    an equalizing control means for receiving both said sence amplifier equalizing signal and said sense amplifier enable signal for generating an equalizing control output signal therefrom;
    a first equalizing signal generation means for receiving said equalizing control output signal for generating a first sense amplifier equalizing signal;
    a second equalizing signal generation means for receiving said equalizing control output signal for generating a second sense amplifier equalizing signal; and
    a third equalizing signal generation means for receiving said second sense amplifier equalizing signal for generating a third amplifier equalizing signal.

2. An equalizing circuit for a sense amplifier according to claim 1 wherein said equalizing control means generates a signal which has a low level portion for equalizing said sense amplifier.

* * * * *